(12) United States Patent
Dekker et al.

(10) Patent No.: US 6,698,073 B2
(45) Date of Patent: Mar. 2, 2004

(54) METHOD OF MANUFACTURING A PIEZOELECTRIC FILTER WITH AN ACOUSTIC RESONATOR SITUATED ON AN ACOUSTIC REFLECTOR LAYER FORMED BY A CARRIER SUBSTRATE

(75) Inventors: Ronald Dekker, Eindoven (NL); Henricus Godefridus Rafael Maas, Eindoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 85 days.

(21) Appl. No.: 09/790,298

(22) Filed: Feb. 21, 2001

(65) Prior Publication Data

US 2001/0023084 A1 Sep. 20, 2001

(30) Foreign Application Priority Data

Feb. 22, 2000 (EP) .............................. 00200615

(51) Int. Cl.$^7$ .......................... H04R 17/10; H05K 3/10
(52) U.S. Cl. ....................... 29/25.35; 29/846; 29/831; 427/100; 156/152; 310/335
(58) Field of Search .......................... 29/846, 825, 847, 29/830, 831, 25.35; 310/335; 427/100; 156/152, 278, 280

(56) References Cited

U.S. PATENT DOCUMENTS

| | | | | |
|---|---|---|---|---|
| 4,990,814 A | * | 2/1991 | Tanski | 310/313 R |
| 5,298,772 A | * | 3/1994 | Peczalski | 257/195 |
| 5,320,977 A | * | 6/1994 | Tanski | 310/313 R |
| 5,527,460 A | * | 6/1996 | Trampler | 210/198.1 |
| 5,626,767 A | * | 5/1997 | Trampler | 210/748 |
| 5,692,279 A | * | 12/1997 | Mang et al. | 29/25.35 |
| 5,872,493 A | * | 2/1999 | Ella | 33/191 |
| 5,873,154 A | | 2/1999 | Ylilammi et al. | |
| 6,208,062 B1 | * | 3/2001 | Nysen | 310/313 R |
| 6,341,408 B2 | * | 1/2002 | Bureau | |

FOREIGN PATENT DOCUMENTS

JP 4-78471 * 3/1992 ............. 156/278 X

OTHER PUBLICATIONS

Liaw et al, "The Characterization of Sputtered Polycrystalline Aluminum Nitride on Silicon by Surface Acoustic Wave Measurements", IEEE Transactions on Ultrasonics, Ferroelectrics and Frequency Control, vol. 42, No. 3, May 1995, p. 404–40.*

* cited by examiner

*Primary Examiner*—A. Dexter Tugbang

(57) ABSTRACT

A method of manufacturing a piezoelectric filter with a resonator comprising a layer of a piezoelectric material (1) which is provided with an electrode (2,3) on either side, which resonator is situated on an acoustic reflector layer (4) formed on a surface (6) of a carrier substrate (7). In the method, the layer of piezoelectric material (1) is provided on a surface (8) of an auxiliary substrate (9), after which a first electrode (2) is formed on the layer of piezoelectric material (1). The acoustic reflector layer (4) is provided on and next to the first electrode (2), and the structure thus formed is secured with the side facing away from the auxiliary substrate (9) on the carrier substrate (7). The auxiliary substrate (9) is removed and a second electrode (3) situated opposite the first electrode (2) is provided.

4 Claims, 3 Drawing Sheets

US 6,698,073 B2

METHOD OF MANUFACTURING A PIEZOELECTRIC FILTER WITH AN ACOUSTIC RESONATOR SITUATED ON AN ACOUSTIC REFLECTOR LAYER FORMED BY A CARRIER SUBSTRATE

FIELD OF THE INVENTION

The invention relates to a method of manufacturing a. piezoelectric filter with an acoustic resonator comprising a layer of a piezoelectric material which is provided with an electrode on either side, which resonator is situated on an acoustic reflector layer formed on a surface of a carrier substrate.

BACKGROUND AND SUMMARY OF THE INVENTION

Such a piezoelectric filter, also referred to as "Thin Film Acoustic Wave Resonator" or "Solidly Mounted Bulk Acoustic Wave Resonator", can particularly suitably be used in electronic circuits employed in equipment for personal wireless communication, such as GSM telephony. For such applications, it is desirable to use filters of small dimensions with a quality factor Q above 1000 and a resonant frequency in the range between 500 MHz and 5 GHz.

The layer of piezoelectric material may be, in practice, for example a layer of aluminium nitride AlN or zinc oxide ZnO. These layers are provided in a thickness which is equal to half the wavelength with which acoustic waves of said frequencies propagate in these materials. The acoustic reflector layer on which the resonator is situated, in practice, generally consists of several layers of alternately a high and a low acoustic impedance. Said layers customarily comprise, for example, tungsten with a comparatively high acoustic impedance of approximately 100 Gg/m$^2$s and, for example, silicon oxide or a synthetic resin with a comparatively low acoustic impedance of, respectively, approximately 13 Gg/m$^2$s and approximately 2 Gg/m$^2$s. These layers are provided in a thickness which is equal to a quarter of the wavelength with which acoustic waves of said frequencies propagate in these materials. For frequencies in said frequency range, both the piezoelectric layers and the layers of the reflector have thicknesses in the range from 1 to 3 $\mu$m. A layer of tungsten can form both an electrode of the resonator and a layer of the acoustic reflector.

In U.S. Pat. No. 5,873,154 a description is given of a method of the type mentioned in the opening paragraph, wherein first an acoustic reflector is formed on a surface of a carrier substrate of, for example, glass, silicon or gallium arsenide, whereafter an acoustic resonator is formed on this reflector. The resonant frequency of the above-described filters is 1 GHz. In one of the examples, the reflector, viewed from the carrier substrate, is composed of an approximately 1.5 $\mu$m thick layer of silicon oxide and an approximately 1.3 $\mu$m thick layer of tungsten, and in another example the reflector is composed of an approximately 0.5 $\mu$m thick layer of a polymer, such as polyimide, and an approximately 1.3 $\mu$m thick layer of tungsten. In both examples, the acoustic resonator comprises an approximately 1 $\mu$m thick layer of zinc oxide.

A drawback of the known method resides in that materials for the layers of the resonator and the acoustic reflector layer cannot be chosen freely and independently. In this known method, the layer of piezoelectric material must be formed at a relatively low temperature. During the formation of this layer, care must be taken not to damage the layers already present on the surface of the carrier substrate. In the second example, where the layer of piezoelectric material is deposited on a layer of polyimide, the temperature of the carrier substrate must not exceed, for example, 350° C. In practice it has also been found that a layer of tungsten having a thickness as mentioned hereinabove may become locally detached from the carrier substrate when it is heated to a temperature of 350° C. This means that in practice the temperature at which the piezoelectric layer can be formed is limited to approximately 300° C. It may however be desirable to deposit this layer at a higher temperature. To deposit a crystalline layer of piezoelectric material wherein the crystals are equally oriented, it is often necessary to heat the carrier substrate during the deposition to a temperature above 300° C. To obtain such a crystalline layer of aluminium nitride it is desirable, for example, to heat the carrier substrate during the deposition to a temperature between 400 and 800° C.

It is an object of the invention to provide a method which enables the materials for the layers of the resonator and the acoustic reflector to be chosen freely and independently.

To achieve this, the method is characterized in accordance with the invention in that the layer of piezoelectric material is provided on a surface of an auxiliary substrate, after which a first electrode is formed on the layer of piezoelectric material, the acoustic reflector layer is provided on and next to the first electrode, and the structure thus formed is secured with the side facing away from the auxiliary substrate on the carrier substrate, after which the auxiliary substrate is removed and a second electrode situated opposite the first electrode is provided.

A customary auxiliary substrate of, for example, glass or silicon can be heated to the above-mentioned high temperatures without any problems during the deposition of the layer of piezoelectric material. After the deposition of the layer of piezoelectric material, an electrode and an acoustic reflector layer are formed on the layer. This can be carried out without causing damage to the layer of piezoelectric material. Customary layers for the electrodes and the acoustic reflector layers can be deposited without the temperature of the auxiliary substrate exceeding 350° C.

Preferably, there is started from an auxiliary substrate in the form of a slice of silicon, which is provided at its surface with a layer of silicon oxide, after which the layer of piezoelectric material is deposited on this layer of silicon oxide, a first electrode is formed on the layer of piezoelectric material, the acoustic reflector layer is provided on and next to the first electrode, and the structure thus formed is secured on the carrier substrate with the side facing away from the auxiliary substrate, whereafter the auxiliary substrate is removed and the exposed layer of silicon oxide is removed at the location of the second electrode to be formed, after which the second electrode is provided. By virtue of the presence of the layer of silicon oxide, a properly oriented layer of crystalline piezoelectric material can be formed in practice, while the auxiliary substrate can also be readily removed because the layer of silicon oxide can be used as a layer on which an etch process stops automatically. In an etch bath comprising potassium hydroxide, silicon can be very selectively etched with respect to silicon oxide.

After the removal of the auxiliary substrate, the second electrode can be readily provided on the layer of piezoelectric material then exposed. While this second electrode can be readily contacted externally, the first electrode cannot be contacted as easily; this requires the formation of a window through the layer of piezoelectric material. Preferably, the second electrode is embodied in the form of two adjacent sub-electrodes, which are both situated opposite the first electrode, so that a piezoelectric filter with two series-connected resonators is formed between the two sub-electrodes. As a result, the filter can be readily contacted externally on the two sub-electrodes. The first electrode is not connected.

A simple construction is further obtained if the auxiliary substrate is secured to the carrier substrate by means of a layer of an adhesive which forms part of the acoustic reflector layer, in particular if the sub-electrode of the acoustic resonator also forms part of the acoustic reflector layer. In practice, this is feasible because a layer of adhesive has a relatively low acoustic resistance and electrode materials have a much higher acoustic resistance. The thickness of the sub-electrode must be chosen so as to be in accordance with the desired resonant frequency of the filter, while the adhesive layer may be much thicker on account of its very low acoustic impedance.

These and other aspects of the invention will be apparent from and elucidated with reference to the embodiments described hereinafter.

BRIEF DESCRIPTION OF THE DRAWING

In the drawings.

The Figures are diagrammatic and not drawn to scale, and corresponding parts bear the same reference numerals whenever possible.

DETAILED DESCRIPTION OF THE INVENTION

Figure 6:
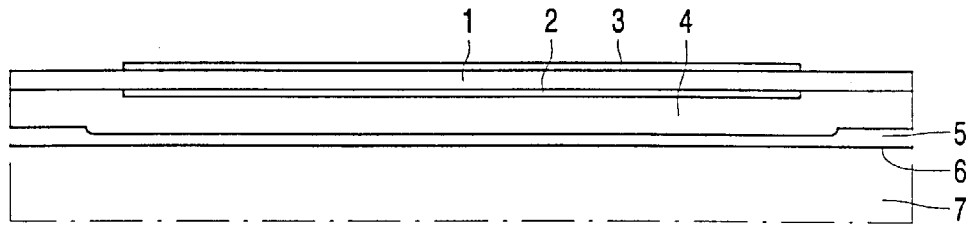
Figure 7:
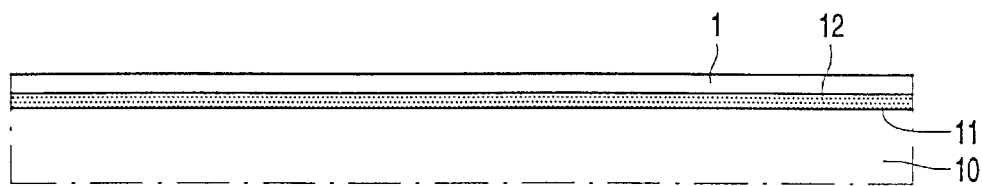
FIG. 7 through FIG. 10 are diagrammatic, cross-sectional views of a few stages in the manufacture of a second example of an acoustic filter manufactured by means of the method in accordance with the invention.
Figure 8:
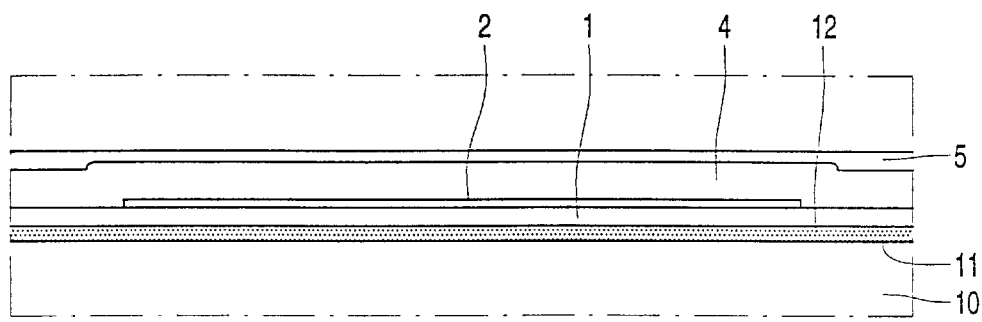
Figure 9:
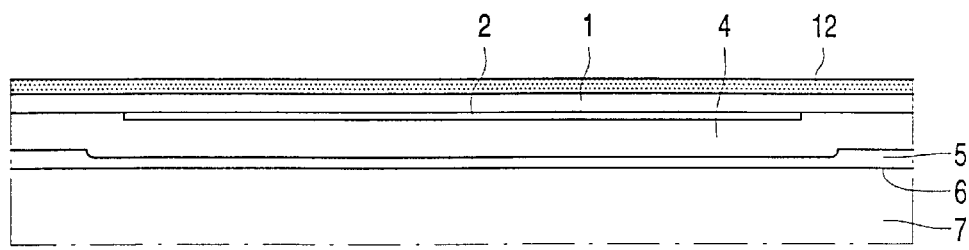

FIGS. 1 through 6 are diagrammatic, cross-sectional views of a few stages in the manufacture of a first example of an acoustic filter comprising, as shown in FIG. 6, a resonator 1, 2, 3, which is composed of a layer of a piezoelectric material 1 which is provided on either side with an electrode 2 and 3, which resonator 1, 2, 3 is situated on an acoustic reflector layer 4 formed, in this example secured by means of an adhesive layer 5, on a surface 6 of a carrier substrate 7.

Such a piezoelectric filter is also referred to as "Thin Film Acoustic Wave Resonator" or "Solidly Mounted Bulk Acoustic Wave Resonator". Such a piezoelectric filter can particularly suitably be used in electronic circuits employed in equipment for personal wireless communication, such as GSM telephony. For such applications, it is desirable to use small-size filters having a quality factor Q above 1000 and a resonant frequency in the range between 500 MHz and 5 GHz.

In the manufacture of the acoustic filter in accordance with the first example, the layer of piezoelectric material 1 is provided on a surface 8 of an auxiliary substrate 9, in this case a plate of glass having a thickness of approximately 500 $\mu$m. During the deposition of the layer of piezoelectric material 1, this auxiliary substrate can be heated to temperatures above 800° C., thus enabling a greater choice of deposition temperatures. To deposit crystalline layers wherein the crystals exhibit an equal orientation, it is often necessary to deposit these crystalline layers at a temperature in the range between 400 and 800° C. In this example, a layer of aluminium nitride (AlN) is deposited in a thickness of approximately 1.3 $\mu$m, and the auxiliary substrate is heated to 650° C.

After the deposition of the layer of piezoelectric material 1, the first electrode 2, in this example an approximately 200 nm thick layer of aluminium, is formed on this layer, and the acoustic reflector layer 4 is provided on and next to the first electrode. In this example, the acoustic reflector layer 4 is composed of a number of sub-layers of tungsten and silicon oxide; first, a layer of silicon oxide is deposited, subsequently a layer of tungsten, a layer of silicon oxide, a layer of tungsten and a layer of silicon oxide. These layers all have a thickness of approximately 1 $\mu$m.

Figure 1:
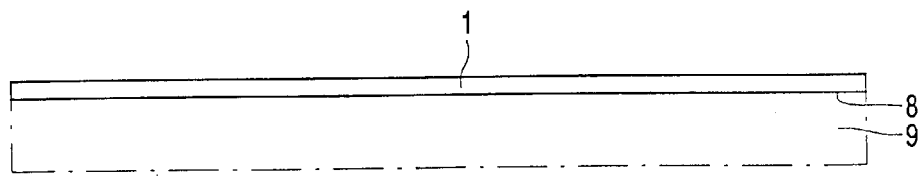
FIG. 1 through FIG. 6 are diagrammatic, cross-sectional views of a few stages in the manufacture of a first example of an acoustic filter manufactured by means of the method in accordance with the invention.
Figure 2:
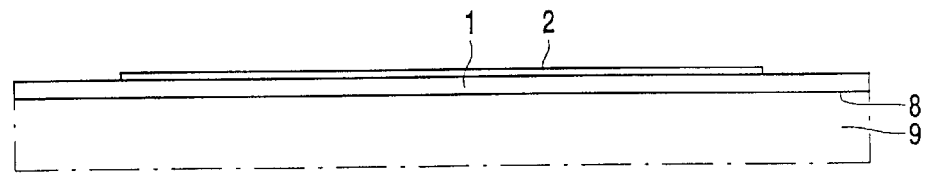
Figure 3:
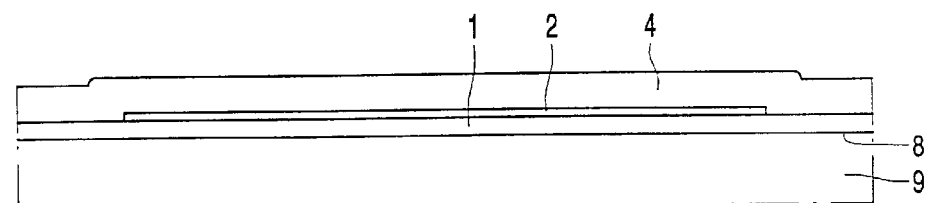
Figure 4:
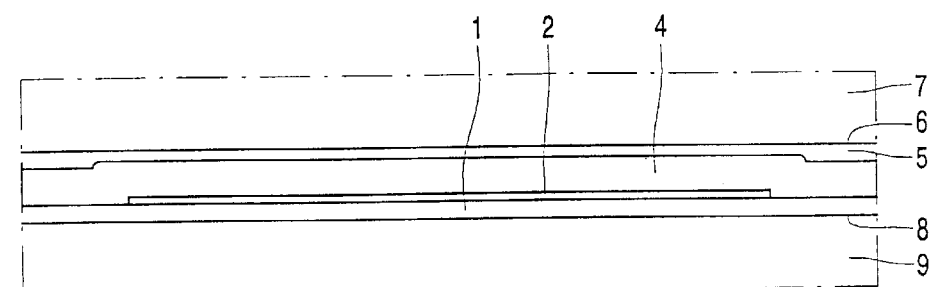
Figure 5:
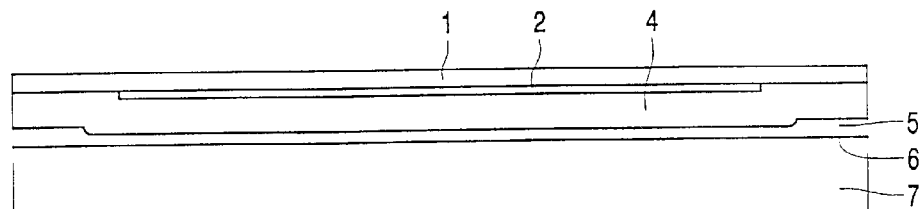

The structure thus formed, shown in FIG. 3, is attached with the side facing away from the auxiliary substrate to the carrier substrate 7, in this example by means of a polyimide adhesive. Subsequently, the auxiliary substrate 9 is removed in two steps. In a first step, a chemical-mechanical polishing treatment is used to remove 400 $\mu$m of the thickness of 600 $\mu$m, and in the second step the remainder is etched away down to the layer of piezoelectric material 1.

Finally, on the exposed layer of piezoelectric material 1, the second electrode 3 is formed opposite the first electrode 2, said second electrode being formed in this case in an approximately 200 nm thick layer of aluminium.

Figure 10:
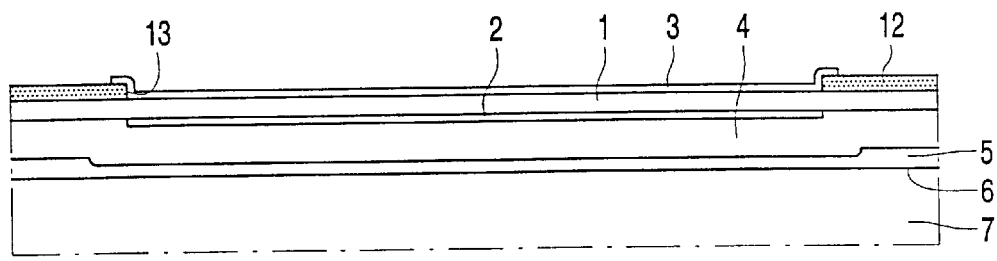

FIGS. 7 through 10 are diagrammatic, cross-sectional views of a few stages in the manufacture of a second example of an acoustic filter comprising, as shown in FIG. 10, a resonator 1, 2, 3, which is situated on an acoustic reflector layer 4, which is attached by means of an adhesive layer 5 to a surface 6 of a carrier substrate 7.

In the second example, there is started from an auxiliary substrate in the form of a slice of silicon 10 which, prior to the deposition of the layer of piezoelectric material 1, is provided at the surface 11 with a layer of silicon oxide 12. The layer of piezoelectric material 1 is deposited on this layer of silicon oxide 12. Subsequently, in accordance with the first example, the first electrode 2 is formed on the layer of piezoelectric material 1, the acoustic reflector layer 4 is provided and the resultant structure is attached to the surface 6 of the carrier substrate 7 by means of an adhesive layer 5.

In the following step, silicon is removed from the slice, resulting in the silicon oxide layer being exposed. Also in this case, silicon is removed in two steps. In the first step, a customary chemical-mechanical polishing treatment is used to remove 400 $\mu$m of the overall thickness of the slice, whereafter, finally, in an etch bath containing potassium hydroxide, the layer of silicon oxide is exposed. The layer of silicon is used as an etch-stop layer in this process. In an etch bath containing potassium hydroxide, silicon can be very selectively etched with respect to silicon oxide. The layer of silicon oxide 12 has the additional advantage that a properly oriented layer of crystalline piezoelectric material can be formed on this material.

After the removal of the auxiliary substrate 10, the layer of silicon oxide then exposed is removed at the location of the second electrode 3 to be formed; a window 13 is formed in the layer of silicon oxide 12. Subsequently, the second electrode 3 is provided in this window 13.

Figure 11:
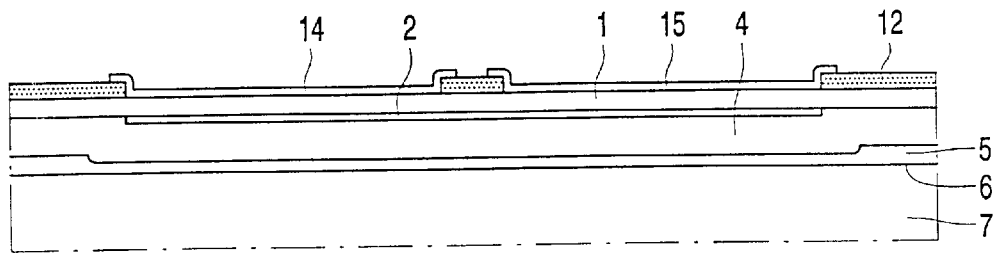
FIG. 11 and FIG. 12 are diagrammatic-cross-sectional views of a few specific solutions which simplify the manufacture of the above-mentioned examples.
Figure 12:
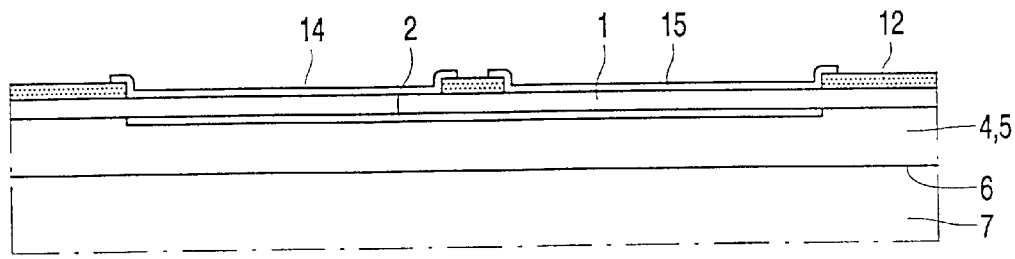

The second electrode 3 can be readily provided in the examples described herein. This second electrode 3 can also be readily contacted externally. The first electrode 2, however, can be contacted less readily; this requires the formation of a window through the layer of piezoelectric material. Preferably, the second electrode 3, as shown in FIG. 11, is embodied in the form of two adjacent sub-electrodes 14 and 15, which are both situated opposite the first electrode 2, so that a piezoelectric filter with two series-connected resonators is formed between the two sub-electrodes 14 and 15. As a result, the filter can now be readily externally contacted on the two sub-electrodes 14 and 15. The first electrode 2 is not connected. The division of the second electrode 3 is shown in the second example; it will be clear that a similar construction can also advantageously be applied in the first example.

A simple construction is also achieved if the auxiliary substrate 10 is secured to the carrier substrate 7 by means of a layer of adhesive which forms part of the acoustic reflector layer 4, in particular if also the first electrode 2 of the acoustic resonator 1, 2, 3 forms part of the acoustic reflector layer 4. In practice, this is possible because a layer of adhesive has a comparatively low acoustic resistance and electrode materials have a much higher acoustic resistance. The thickness of the sub-electrode must then be chosen to correspond to the desired resonant frequency of the filter; the adhesive layer may be much thicker on account of its very low acoustic impedance.

What is claimed is:

1. A method of manufacturing a piezoelectric filter with a resonator comprising the steps of:

providing a layer of a piezoelectric material on a surface of an auxiliary substrate;

providing a resonator on an acoustic reflector layer formed on a surface of a carrier substrate;

forming a first electrode on the layer of piezoelectric material;

providing an acoustic reflector layer on and next to the first electrode;

securing a structure thus formed with a side facing away from the auxiliary substrate on the carrier substrate;

removing the auxiliary substrate; and providing a second electrode situated opposite the first electrode;

wherein there is started from the auxiliary substrate in the form of a slice of silicon which is provided at the surface of the auxiliary substrate with a layer of silicon oxide, after which the layer of piezoelectric material is deposited on this layer of silicon oxide, the first electrode is formed on the layer of piezoelectric material, the acoustic reflector layer is provided on and next to the first electrode, and the structure thus formed is secured with the side facing away from the auxiliary substrate on the carrier substrate, whereafter the auxiliary substrate is removed and the exposed layer of silicon oxide is removed at the location of the second electrode to be formed, after which the second electrode is provided.

2. A method as claimed in claim 1, wherein the step of securing auxiliary substrate on the carrier substrate by means of a layer of an adhesive which forms part of the acoustic reflector layer.

3. A method as claimed in claim 1, wherein the second electrode is embodied in the form of two adjacent sub-electrodes which are both situated opposite the first electrode, so that a piezoelectric filter with two series-connected resonators is formed between the two sub-electrodes.

4. A method as claimed in claim 1, wherein the step of forming the first electrode on the layer of piezoelectric material forms part of the acoustic reflector layer.

* * * * *